United States Patent
Alhalabi et al.

(10) Patent No.: US 10,748,592 B2
(45) Date of Patent: Aug. 18, 2020

(54) COMPACT MAGNETIC STORAGE MEMORY CELL

(71) Applicants: Commissariat à l'Énergie Atomique et aux Énergies Alternatives, Paris (FR); Centre National de la Recherche Scientifique, Paris (FR)

(72) Inventors: Rana Alhalabi, Grenoble (FR); Grégory Di Pendina, Echirolles (FR)

(73) Assignees: Commissariat à l'Énergie Atomique et aux Énergies Alternatives, Paris (FR); Centre National de la Recherche Scientifique, Paris (FR)

(*) Notice: Subject to any disclaimer, the term of this patent is extended or adjusted under 35 U.S.C. 154(b) by 0 days.

(21) Appl. No.: 16/458,716

(22) Filed: Jul. 1, 2019

(65) Prior Publication Data

US 2020/0005844 A1    Jan. 2, 2020

(30) Foreign Application Priority Data

Jul. 2, 2018  (EP) .................................... 18305855

(51) Int. Cl.
| | | |
|---|---|---|
| *G11C 11/00* | (2006.01) | |
| *G11C 11/15* | (2006.01) | |
| *G11C 11/16* | (2006.01) | |

(52) U.S. Cl.
CPC .......... *G11C 11/15* (2013.01); *G11C 11/1659* (2013.01); *G11C 11/1673* (2013.01); *G11C 11/1675* (2013.01)

(58) Field of Classification Search
CPC . G11C 16/30; G11C 13/0069; G11C 16/0483; G11C 13/004; G11C 11/1675; G11C 13/0004; G11C 13/0007; G11C 11/1673; G11C 16/12; G11C 16/26; G11C 2013/0054
USPC ......... 365/148, 158, 185.22, 185.29, 185.03, 365/185.18, 185.23, 189.09, 163, 230.03, 365/149, 171, 185.05
See application file for complete search history.

(56) References Cited

U.S. PATENT DOCUMENTS

| | | | |
|---|---|---|---|
| 2008/0175041 A1 | 7/2008 | Aoki | |
| 2013/0208247 A1* | 8/2013 | Huang | G02B 30/23 353/7 |

(Continued)

FOREIGN PATENT DOCUMENTS

| | | |
|---|---|---|
| CN | 104134461 A | 11/2014 |
| CN | 104733036 A | 6/2015 |

OTHER PUBLICATIONS

European Search Report for European Application No. 18305855, dated Oct. 1, 2018.

(Continued)

*Primary Examiner* — Thong Q Le
(74) *Attorney, Agent, or Firm* — Wolf, Greenfield & Sacks, P.C.

(57) ABSTRACT

A memory comprising an array of memory cells, each memory cell comprising: first and second resistive storage elements each having at least first and second terminals; and a first transistor having: a first main conducting node connected to the first terminal of the first resistive element and to a first column/row line of the array; and a second main conducting node connected to the first terminal of the second resistive element and to a second column/row line of the array.

13 Claims, 5 Drawing Sheets

(56) References Cited

U.S. PATENT DOCUMENTS

2014/0078810 A1    3/2014  Prenat et al.
2015/0036415 A1    2/2015  Di Pendina et al.

OTHER PUBLICATIONS

Prenat et al., Ultra-Fast and High-Reliability SOT-MRAM: From Cache Replacement to Normally-Off Computing. IEEE Transactions on Multi-Scale Computing Systems. Jan.-Mar. 2016;2(1):49-60.

Seo et al.. High-Density SOT-MRAM Based on Shared Bitline Structure, IEEE Transactions on Very Large Scale Intergration (VLSI) Systems. Aug. 2018,26(8):1600-3.

* cited by examiner

COMPACT MAGNETIC STORAGE MEMORY CELL

RELATED APPLICATIONS

This application claims priority to European Patent Application number 18305855.1, filed on Jul. 2, 2018, the contents of which is incorporated herein by reference in its entirety.

TECHNICAL FIELD

The present disclosure relates generally to the field of memory cells and methods of writing and/or reading memory cells, and in particular to memory cells comprising resistive storage elements.

BACKGROUND

It has been proposed to use resistive storage elements in memory cells to provide non-volatile data storage. Such elements are programmable to adopt one of two different resistive states. The programmed resistive state is maintained even when a supply voltage of the memory cell is disconnected, and thus data can be stored by such elements in a non-volatile fashion.

Various types of programmable resistive storage elements have been proposed, some of which are magnetic storage elements capable of being programmed by the direction of a current that is passed through the element. An example of such a current-programmable magnetic storage element is a magnetic tunnel junction having a write mechanism based on spin transfer torque (STT) or spin orbit torque (SOT).

Other examples of programmable resistive storage elements include those used to form PCRAM (Phase Change Random Access Memory), OxRAM (metal Oxide RAM) and CBRAM (Conductive Bridging RAM).

In a memory array comprising programmable storage elements, each memory cell generally comprises several transistors that permit the memory cell to be selected and programmed. It would however be desirable to reduce the surface area of each memory cell in order to provide a non-volatile memory having greater density, and thus more storage capacity and/or a reduced overall surface area.

SUMMARY

It is an aim of embodiments of the present disclosure to at east partially address one or more needs in the prior art.

According to one aspect, there is provided a memory comprising an array of memory cells, each memory cell comprising: first and second resistive storage elements each having at least first and second terminals; and a first transistor having: a first main conducting node connected to the first terminal of the first resistive element and to a first column/row line of the array; and a second main conducting node connected to the first terminal of the second resistive element and to a second column/row line of the array. For example, the memory further comprises a switch circuit comprising: a first switch configured to be capable of coupling together the first and second terminals of the first resistive storage element of each memory cell of a first row or column of the array; and a second switch configured to be capable of coupling together the first and second terminals of the second resistive storage element of each memory cell of the first row or column of the array.

According to one embodiment, the first transistor further comprises a gate node connected to a third column/row line of the array.

According to one embodiment, the second terminal of the first resistive element is connected to a fourth column/row line of the array; and the second terminal of the second resistive element is connected to a fifth column/row line of the array.

According to one embodiment, the first resistive storage element is configured to be programmable to have a high or low resistive state as a function of the direction of a write current driven through its first and second terminals.

According to one embodiment, the second resistive storage element further comprises a third terminal and is configured to be programmable to have a high or low resistive state as a function of the direction of a write current driven through its second and third terminals.

According to one embodiment, each memory cell further comprises a second transistor (312) coupling the third terminal of the second resistive storage element to the fourth column/row line.

According to one embodiment, the second resistive element is configured to be programmable to have a high or low resistive state as a function of the direction of a write current driven through its first and second terminals.

According to one embodiment, the first and second resistive elements each comprise a third terminal and are configured to be programmable to have a high or low resistive state as a function of the direction of a write current driven through its second and third terminals.

According to one embodiment, each memory cell further comprises: a third resistive storage element having first and second terminals; and a third transistor having: a first main conducting node connected to the second terminal of the first resistive storage element; and a second main conducting node connected to the first terminal of the third resistive storage element and to a sixth column/row line of the array.

According to one embodiment, at least one of the first and second resistive storage elements is a magnetic storage element.

According to one embodiment, at least one of the first and second resistive storage elements is one of: a spin transfer torque element with in-plane anisotropy; a spin transfer torque element with perpendicular-to-plane anisotropy; a spin orbit torque magnetic tunnel junction; a metal oxide RAM element; a phase change RAM element; a phase change RAM element; a ferroelectric RAM element; and a conductive bridging RAM element. Of course, this is not an exhaustive list, and other types of resistive storage elements could be used.

According to a further aspect, there is provided a method of accessing a memory cell of an array, each memory cell having first and second resistive storage elements each having first and second terminals, and a first transistor coupling together first terminals of the first and second resistive storage elements, the method comprising: bypassing, using for example a switch circuit, one of the first and second resistive storage elements via column/row lines of the memory array in order to access the other of the first and second resistive storage elements. The switch circuit for example comprises: a first switch configured to be capable of coupling together the first and second terminals of the first resistive storage element of each memory cell of a first row or column of the array; and a second switch configured to be capable of coupling together the first and second terminals of the second resistive storage element of each memory cell of the first row or column of the array.

According to one embodiment, the method further comprises: applying a first voltage to a fourth column/row line of the array connected to the second terminal of the first resistive element; and applying a second voltage to a fifth column/row line of the array connected to the second terminal of the second resistive element.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Figure 1:
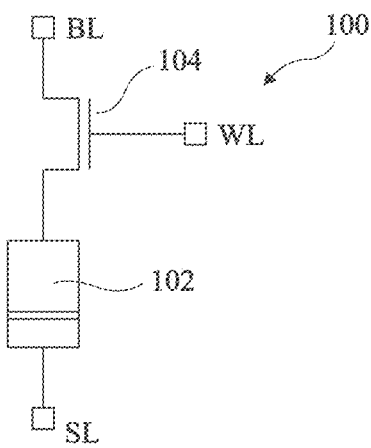
FIG. 1 schematically illustrates an example of a memory cell comprising a resistive storage element having two terminals.

FIG. 1 schematically illustrates an example of a non-volatile memory cell 100 of a memory array. The memory cell 100 comprises a resistive storage element 102 having two terminals and coupled in series with an n-channel MOS transistor 104 between a bit line BL and a source line SL. The gate of the transistor 104 is controlled by a word line WL. The resistive storage element 102 is programmable to store one of two resistive states to represent one bit of data. The element 102 is programmed and read by activating the transistor 104. The cell 100 can be classified as a 1T cell as it comprises one transistor per bit of storage capacity.

Figure 2:
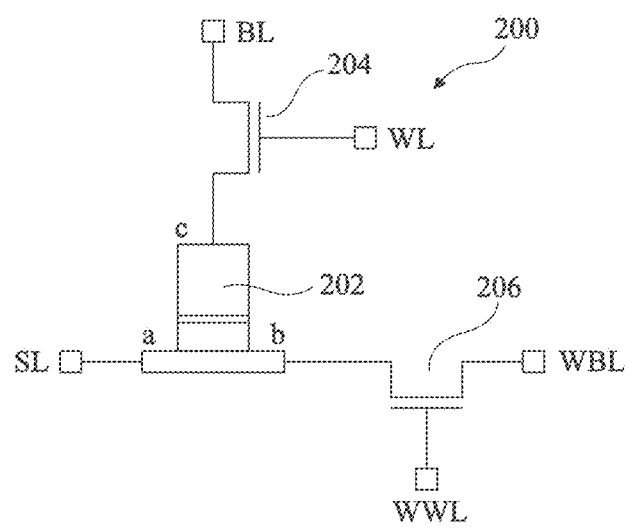
FIG. 2 schematically illustrates an example of a memory cell comprising a resistive storage element having three terminals.

FIG. 2 schematically illustrates an example of a non-volatile memory cell 200 of a memory array. The memory cell 200 comprises a programmable storage element 202 having three terminals a, b and c. The terminal c is coupled to a bit line BL via an n-channel MOS transistor 204. The gate of the transistor 204 is controlled by a word line WL. The terminal a of the element 202 is connected to a source line SL, and the terminal b is connected to a bit line WBL via an n-channel MOS transistor 206. The gate of the transistor 206 is controlled by a word line WWL. The resistive storage element 202 is programmable to store one of two resistive states to represent one bit of data. The element 202 is programmed by activating the transistor 206 and passing a current between the source line SL and the bit line WBL. The element 202 is read via the bit line BL and source line SL by activating the transistor 204. An advantage of the element 202 is that the use of different terminals of the device for read and write operations reduces the risk of it being erroneously programmed during a read operation. The cell 200 can be classified as a 2T cell as it comprises two transistors per bit of storage capacity.

Figure 3:
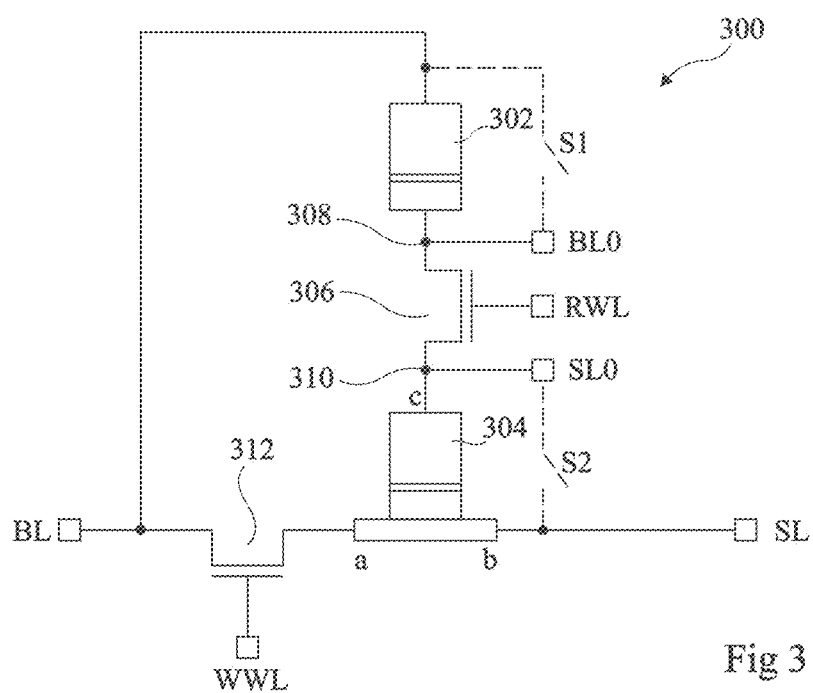
FIG. 3 schematically illustrates a non-volatile memory cell according to an example embodiment of the present disclosure.

FIG. 3 schematically illustrates a non-volatile memory cell 300 according to an example embodiment of the present disclosure. The memory cell 300 for example comprises programmable storage elements 302 and 304. The element 302 has two terminals, while the element 304 has a three terminals labelled a, b and c. One terminal of the element 302 is coupled or connected to a bit line BL and the other terminal is coupled via a transistor 306 to the terminal c of the element 304. The gate of the transistor 306 is controlled by a word line RWL. An intermediate node 308 between the element 302 and the transistor 306 is coupled or connected to a bit line BL0, and an intermediate node 310 between the element 304 and the transistor 306 is coupled or connected to a source line SL0. The terminal a of the element 304 is coupled or connected to the bit line BL via a transistor 312. The gate of the transistor 312 is controlled by a word line WWL. The terminal b of the element 304 is coupled or connected to a source line SL.

In some embodiments, the transistors 306 and 312 are n-channel MOS transistors, although in alternative embodiments p-channel MOS transistors could be used, or other transistor technologies.

As represented by dashed lines in FIG. 3, the element 302 can be bypassed by a switch S1 coupled for example between the bit lines BL and BL0, and the terminals b and c of the element 304 can be short circuited for example by a switch S2 coupled between the source lines SL and SL0. These switches S1 and S2 do not form part of the memory cell 300, and are for example common for a plurality of memory cells formed in the memory array.

Each of the resistive storage elements 302, 304 for example has just two resistive states corresponding to high and low resistances Rmax and Rmin, but the exact values of Rmin and Rmax may vary depending on conditions such as process, materials, temperature variations etc.

The resistive storage elements 302, 304 are for example selected such that Rmax is always significantly greater than Rmin, for example at least 20 percent greater. In general, the ratio between the resistance Rmax and the resistance Rmin is for example between 1.2 and 10000. Rmin is for example in the region of 2 k ohms or less, and Rmax is for example in the region of 6 k ohms or more, although many other values are possible.

The resistive storage elements 302 and 304 are each programmable to store one of two resistive states, each element thereby storing one bit of data. Like the element 102 of FIG. 1, the element 302 is programmed and read via its two terminals.

In the circuit of FIG. 3, the element 302 is for example programmed and read by activating the transistor 306 and the switch S2, and passing a current through the element 302 via the bit line BL and source line SL. During a write operation, the direction of this current for example determines whether a "0" or a "1" is programmed to the storage element 302. The transistor 312 and switch S1 remain inactive, i.e. non-conductive.

The element 304 is for example programmed by activating the transistor 312 while the transistor 306 remains inactive, and passing a current through the terminals a and b of the element 304, via the bit line BL and source line SL. The direction of this current for example determines whether a "0" or a "1" is programmed to the storage element 304.

The element 304 is for example read by activating the switch S1 and the transistor 306, and passing a current through the terminals c and b of the element 304, via the bit line BL and source line SL. The transistor 312 and switch S2 for example remain inactive, i.e. non-conductive.

The cell 300 can be classified as a 1T cell, as it comprises one transistor per bit of storage capacity. Furthermore, the element 304 has the advantage of being a three terminal device, namely that different terminals of the device are used for read and write operations, reducing the risk of the device being erroneously programmed during a read operation.

The resistive storage element 302 is for example a spin transfer torque element with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive storage element could be another type of two-terminal resistive storage element, such as those used in PCRAM (Phase Change Random Access Memory), OxRAM (metal oxide RAM), FeRAM (ferroelectric RAM), or CBRAM (Conductive Bridging RAM). For example, phase change RAM is described in more detail in the publication by Wong, H-S. Philip, et al. entitled "Phase Change Memory", Proceedings of IEEE 98, 12 (2010): 2201-2227. OxRAM is described in more detail in the publication by Vianello, E. et al. entitled "Resistive memories for ultra-low-power embedded computing design", Electron Devices Meeting (IEDM), 2014 IEEE International. CBRAM is described in more detail in the publication by Stefan Dietrich, et al. entitled "A nonvolatile 2-Mbit CBRAM memory core featuring advanced read and program control", IEEE Journal of Solid-State Circuits 42.4 (2007): 838-845.

The resistive storage element 304 is for example a spin-orbit torque magnetic tunnel junction (SOT-MTJ). Such a device is for example described in more detail in the publication titled "Voltage and Energy-Delay Performance of Giant Spin Hall Effect Switching for Magnetic Memory and Logic", S. Manipatruni et al., and in the publication titled "Spin-Torque Switching with the Giant Spin Hall Effect of Tantalum", Luqiao Liu et al., DOI: 10.1126/science.1218197 Science 336, 555 (2012). Alternatively, the resistive storage element could be another type of three-terminal resistive storage element.

Figure 4:
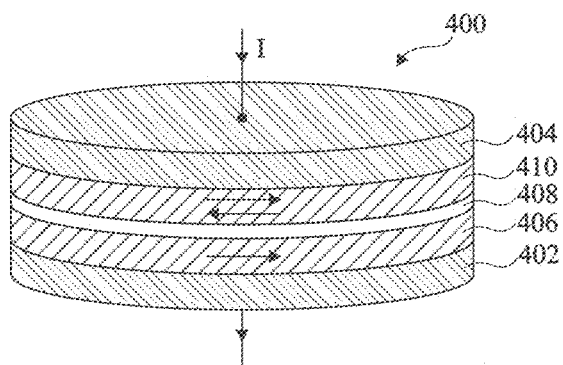
FIG. 4 illustrates a resistive spin transfer torque (STT) element with in-plane magnetic anisotropy according to an example embodiment.

FIG. 4 illustrates an STT resistive storage element 400 with in-plane magnetic anisotropy that could be used to implement the resistive storage element 302 of FIG. 3. The element 400 is for example substantially cylindrical, but has a cross-section which is non-circular, for example oval, which leads for example to an increase in the retention stability of the resistive states when the device is programmed.

The element 400 comprises bottom and top electrodes 402 and 404, each being substantially disc-shaped, and sandwiching a number of intermediate layers between them. The intermediate layers comprise, from bottom to top, a pinned layer 406, an oxidation barrier 408, and a storage layer 410.

The oxidation barrier 408 is for example formed of MgO or $Al_xO_y$. The pinned layer 406 and storage layer 410 are for example ferromagnetic materials, such as CoFe or CoFeB. The spin direction in the pinned layer 406 is fixed, as represented by an arrow from left to right in FIG. 4. Of course, in alternative embodiments the spin direction could be from right to left in the pinned layer 406. However, the spin direction in the storage layer 410 can be changed, as represented by arrows in opposing directions in FIG. 4. The spin direction is programmed by the direction of the write current I passed through the element, such that the spin direction in the storage layer 410 is parallel, in other words in the same direction, or anti-parallel, in other words in the opposite direction, to that of the pinned layer 406.

Figure 5:
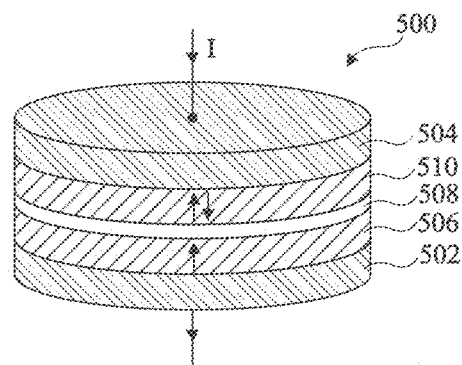
FIG. 5 illustrates a resistive spin transfer torque (STT) element with perpendicular-to-plane magnetic anisotropy according to an example embodiment.

FIG. 5 illustrates an STT resistive element 500 with perpendicular-to-plane magnetic anisotropy that could be used to implement the resistive storage element 302 of FIG. 3 as an alternative to the device of FIG. 4. The resistive element 500 can for example be programmed by a lower write current I than the element 400 for a given size and/or for a given storage layer volume.

Element 500 is substantially cylindrical, and for example has a cross-section which is circular. The element 500 comprises bottom and top electrodes 502 and 504, each being substantially disc-shaped and sandwiching a number of intermediate layers. The intermediate layers comprise, from bottom to top, a pinned layer 506, an oxidation barrier 508, and a storage layer 510. These layers are similar to the corresponding layers 406, 408 and 410 of element 400, except that the pinned layer 506 and storage layer 510 have perpendicular-to-plane anisotropy, as represented by the vertical arrows in layers 506 and 510 of FIG. 5. The pinned layer 506 is illustrated as having a spin direction from bottom to top in FIG. 5, but of course, in alternative embodiments, this spin direction could be from top to bottom.

Figure 6:
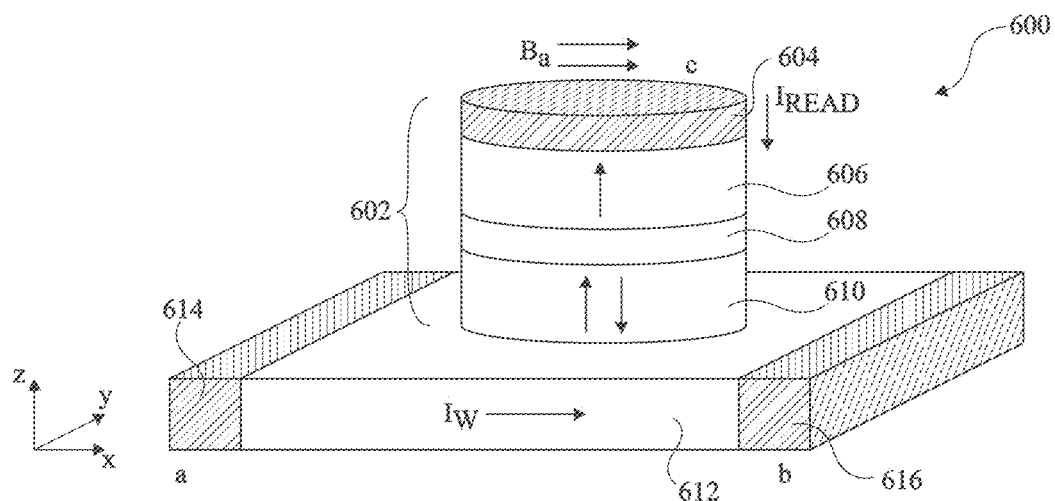
FIG. 6 illustrates a resistive spin-orbit torque magnetic tunnel junction (SOT-MTJ) according to an example embodiment.

FIG. 6 illustrates an example of a spin-orbit torque magnetic tunnel junction (SOT-MTJ) 600 that could be used to implement the resistive storage element 304 of FIG. 3.

The resistive memory element 600 comprises three connection terminals, labelled a, b and c in FIG. 6. The terminal c is part of a resistive stack 602, which comprises an electrode 604 formed over a reference nano-magnet layer 606. Layer 606 is in turn formed over an insulator layer 608, and layer 608 is in turn formed over a storage nano-magnet layer 610.

The reference layer 606 corresponds to a magnetic layer in which the direction of magnetization is fixed. The storage layer 610 on the contrary corresponds to a magnetic layer in which the direction of magnetization can be controlled.

The resistive stack 602 is formed over a conducting layer 612, which provides the interface for programming the direction of magnetization of the storage layer 610. The conducting layer 612 is for example formed of: β-tantalum (β-Ta); β-tungsten (β-W); and/or platinum (Pt), and for example comprises, at opposing ends, an electrode 614 forming a terminal a of the element 600 and an electrode 616 forming a terminal b of the element 600.

As shown by arrows B, in FIG. 6, a static magnetic field, for example provided by a permanent magnet or a bias layer, can in some embodiments be optionally provided close to the reference layer 606. Such a magnetic field is for example discussed in more detail in the publication titled "Perpendicular switching of a single ferromagnetic layer induced by in-plane current injection" Ioan mihai Miron et al., Nature 476, 189-193, DOI: 10.1038/nature10309.11, August 2011.

During a write operation, a current is applied from the terminal a towards the terminal b, or in the opposite direction, in order to program the direction of magnetization in the storage layer 610. As shown by arrows x, y, and z in FIG. 6, the direction of the write current $I_W$ flowing through the conducting layer 612 from terminal a towards terminal b will be called the +x direction, the direction perpendicular to +x direction in the plane of the conducting layer will be called the +y direction, and the upward direction perpendicular to +x and +y directions will be called the +z direction. A positive write current $I_W$ in the +x direction will cause the direction of magnetization of layer 610 to be aligned in the +y direction. A negative write current IW in the −x direction will cause the direction of magnetization of layer 610 to be aligned in the −y direction. The programming of a magnet by a current is for example described in more detail in the publication by K. Garello et al. entitled "Symmetry and magnitude of spin-orbit torques in ferromagnetic heterostructures", Mesoscale and Nanoscale Physics, Nature Nanotechnology 8, 587-593 (2013).

When the direction of magnetization in the storage layer 610 is the same as that of the reference layer 606, the resistance of the resistive stack 602 is for example at a relatively low value Rmin. When the direction of magnetization in the storage layer 610 is opposite to that of the reference layer 606, the resistance of the resistive stack 602 is for example at a relatively high value Rmax.

It will be apparent to those skilled in the art that the structure represented in FIG. 6 provides just one example of a possible structure of a three-terminal programmable resistive element. In alternative embodiments, one or more additional layers could be included, and different combinations of materials could be used. Furthermore, it will be apparent to those skilled in the art that an additional read node could be provided, for example on the underside of the conducting layer 612, or elsewhere, such that the electrodes 614 and 616 are used exclusively for writing.

Figure 7:
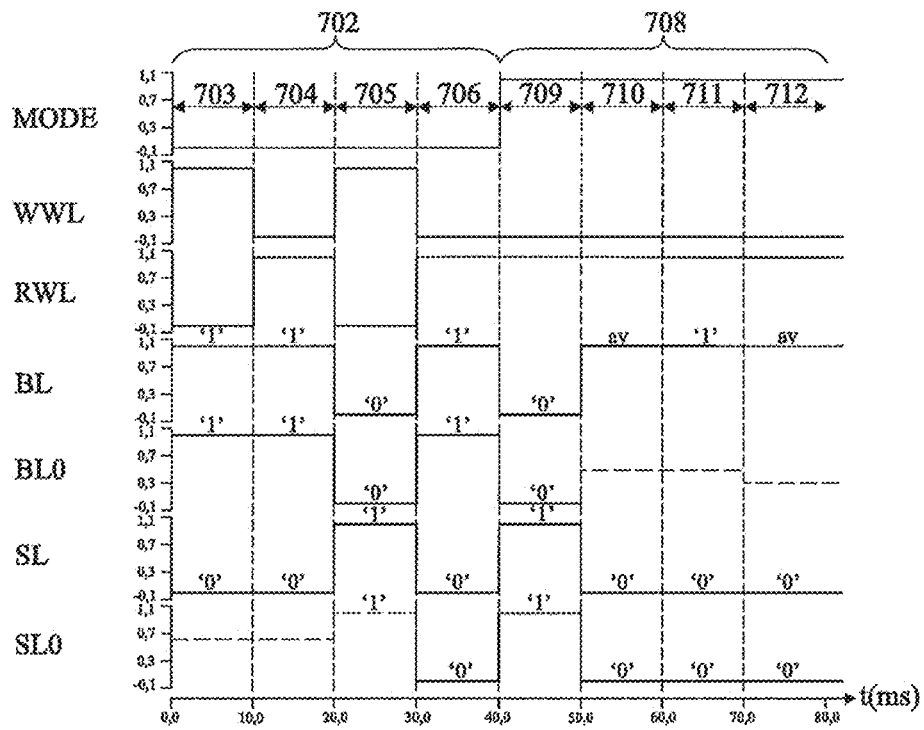
FIG. 7 is a timing diagram illustrating an example of signals in the memory cell of FIG. 3 during write and read operations according to an example embodiment of the present disclosure.

FIG. 7 is a timing diagram illustrating examples of signals in the memory cell 300 of FIG. 3 during read and write operations of the resistive storage elements 302 and 304.

FIG. 7 illustrates a signal MODE (not shown in FIG. 3) representing the operating mode of the memory array, and in particular indicating whether the operation concerns the element 302 or 304 of each memory cell. While the signal MODE is low, the element 304 is for example programmed, and while the signal MODE is high, the element 302 is for example programmed. The switch S1 is for example controlled by the inverse of the signal MODE, and is thus conducting when the signal MODE is low, and non-conducting when the signal MODE is high. The switch S2 is for example controlled by the signal MODE, and is thus conducting when the signal MODE is high, and non-conducting when the signal MODE is low.

FIG. 7 also illustrates the signals on the word lines WWL, RWL, on the bit lines BL, BL0, and on the source lines SL and SL0.

A first series 702 of four access operations in FIG. 7 correspond to read and write operations to the element 304. Thus the switch S1 is conducting, thereby bypassing the element 302, and the switch S2 non-conducting. The source line SL0 is floating and thus at an undetermined state.

In a write operation 703, a "0" bit is written to the element 304 of the memory cell by asserting the signals on the word line WWL and bit line BL, and bringing low the signal on the source line SL. This for example corresponds to programming the element 304 to have a low resistive state.

In a read operation 704, the signal on the word line WWL is brought low to deactivate the transistor 312, and the signal on the word line RWL is asserted to activate the transistor 306. Furthermore, the signal on the bit line BL is high and the signal on the source line SL is low to cause a read current to flow through the element 304. This current can for example be measured via the bit line BL or source line SL. In view of the programmed low resistive state of the element 304, this current is for example relatively high.

In a write operation 705, a "1" bit is written to the element 304 of the memory cell by asserting the signals on the word line WWL and source line SL, and bringing low the signal on the bit line BL. This for example corresponds to programming the element 304 to have a high resistive state.

In a read operation 706, the signal on the word line WWL is brought low to deactivate the transistor 312, and the signal on the word line RWL is asserted to activate the transistor 306. Furthermore, the signal on the bit line BL is brought high and the signal on the source line SL is brought low to cause a read current to flow through the element 304. This current can for example be measured via the bit line BL or source line SL. In view of the programmed high resistive state of the element 302, this current is for example relatively low.

A further series 708 of four access operations in FIG. 7 correspond to read and write operations to the element 302. Thus the switch S2 is conducting, thereby bypassing the element 304, and the switch S1 non-conducting. Furthermore, the signal on the word line WWL is for example low, and the signal on the word line RWL is for example high, during each of the access operations to the element 302.

In a write operation 709, a "1" bit is written to the element 302 of the memory cell by asserting the signal on the source line SL and applying a low state to the bit line BL. This for example corresponds to programming the element 304 to have a high resistive state.

In a read operation 710, the signal on the bit line BL is brought high. As represented by the letters 'av', this signal is for example brought to an analog voltage level that is lower than the level of the write voltage in order to avoid programming the memory cell during the read operation.

The signal on the source line SL is also brought low to cause a read current to flow through the element 302. This current can for example be measured via the bit line BL or source line SL. In view of the programmed high resistive state of the element 302, this current is for example relatively low.

In a write operation 711, a "0" bit is written to the element 302 of the memory cell by asserting the signal on the bit line BL, and bringing low the signal on the source line SL. This for example corresponds to programming the element 302 to have a low resistive state.

In a read operation 712, the signal on the bit line BL is brought to the level av, and the signal on the source line SL is brought low to cause a read current to flow through the element 302. This current can for example be measured via the bit line BL or source line SL. In view of the programmed low resistive state of the element 302, this current is for example relatively high.

Figure 8:
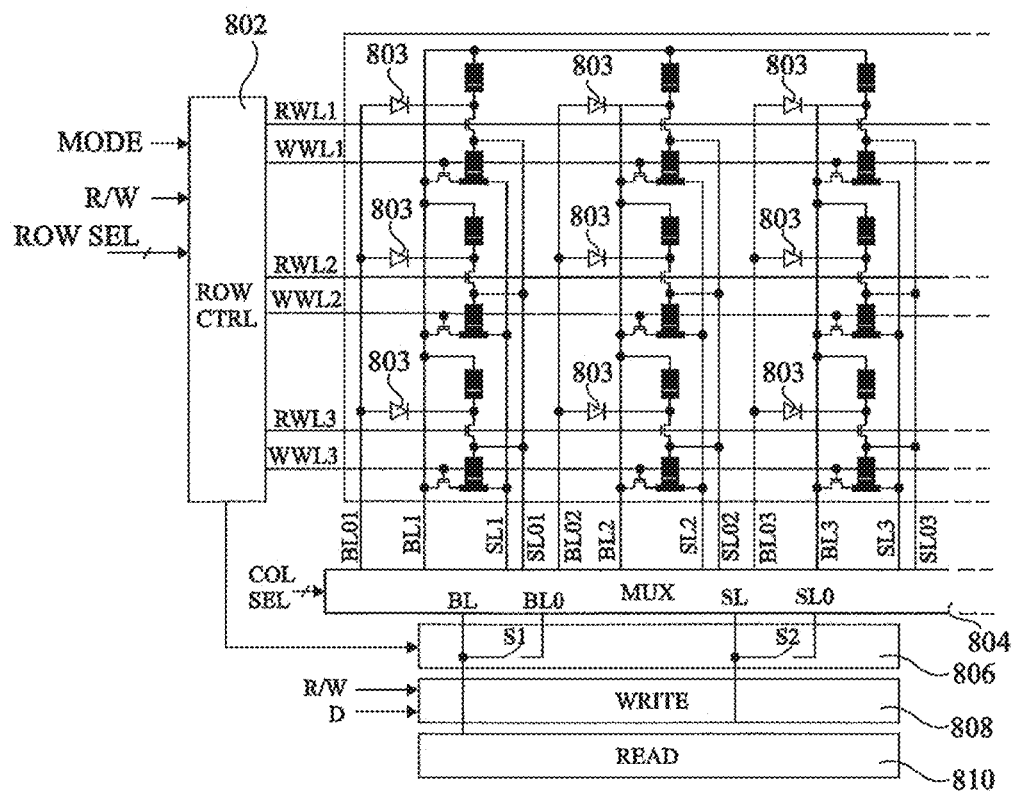
FIG. 8 schematically illustrates a memory array according to an example embodiment of the present disclosure.

FIG. 8 schematically illustrates a non-volatile memory 800 comprising an array of memory cells each corresponding to the memory cell 300 of FIG. 3. The example of FIG. 8 comprises three rows of memory cells, and three columns are illustrated. In alternative embodiments, the array could comprise any number of rows and columns. For example, there are at least two rows or at least two columns. The array could also comprise several memory banks, including in some embodiments memory banks of different types, such as one bank of the memory cells 300, and another bank of volatile memory cells or of another type of non-volatile memory cells.

The memory cells of each row are for example coupled or connected to a common word line RWLi and a common word line WWLi, where i is the row number, equal to 1, 2 and 3 in the example of FIG. 8. A row control circuit (ROW CTRL) 802 for example generates the word line signals on the word lines RWLi and WWLi for each row. The row control circuit 802 for example receives the signal MODE, and a signal R/W indicating whether a read or write operation is to be performed, and a row selection signal ROW SEL indicating the row of the memory cell to be read or written to.

The memory cells of each column are for example coupled or connected to a common bit line BLj, to a common bit line BL0j, to a common source line SLj and to a common source line SL0j, where j is the column number. In some embodiments, a diode 803 is connected between the node 308 of each memory cell and the corresponding bit line BL0j in order to prevent current returning on this bit line. In particular, the cathode of each diode 803 is for example connected to the node 308 of the corresponding memory cell. In alternative embodiments, a single diode could be connected to the bottom of each bit line BL0j.

The bit lines BLj, BL0j and source lines SLj, SL0j are for example coupled or connected to a multiplexer (MUX) 804. The memory 800 further comprises a switch circuit 806, a write circuit (WRITE) 808 and a read circuit (READ) 810. The switch circuit 806 for example receives the bit line BL and source line SL from the read and write circuits 808, 810, and comprises the switch S1 coupling the bit line BL to the bit line BL0, and the switch S2 coupling the source line SL to the source line SL0. The switches S1 and S2 are for example implemented by pass gates or by one or more transistors. The multiplexer 804 for example receives a column selection signal COL SEL for selecting the column of a memory cell to be read or written to. The multiplexer 804 connects the bit lines BL, BL0 and source lines SL, SL0 to the corresponding lines BLj, BL0j, SLi, SL0i of a column of the array selected by the COL SEL signal.

The bit line BL and source line SL are further coupled to the write circuit 808, which also receives the signal R/W, and a data signal D. During a write operation, the circuit 808 applies voltages to the lines BL and SL in order to generate a current in one direction or the other based on the data D to be written to the selected memory cell.

The bit line BL is also for example coupled to the read circuit 810 such that during a read operation the current level on the bit line BL can be detected in order to determine whether the selected element 302, 304 of the selected memory cell has been programmed with a resistance of Rmin or Rmax.

Thus in the example of FIG. 8, a single switch S1 and a single switch S2 can be provided for the entire memory array, and the multiplexer 804 is used to couple these switches to the column lines of the selected memory cell. In alternative embodiments, a pair of switches S1, S2 could be provided for each column of the memory array, the switch S1 of each column j coupling the bit lines BLj, BL0j, and the switch S2 of each column j coupling the source lines SLj, SL0j. An advantage of providing switches S1, S2 for each column is that the read and write operations can be performed on more than one memory cell of a given row at the same time. For example, an entire row of memory cells can be read or written at once.

While the embodiments of FIGS. 3 and 8 are based on a memory cell 300 comprising a resistive storage element having two terminals and a resistive storage element having three terminals, other combinations of resistive storage elements, and more than two resistive storage elements could be implemented in each memory cell, as will now be described in more detail with reference to FIGS. 9 to 12.

Figure 9:
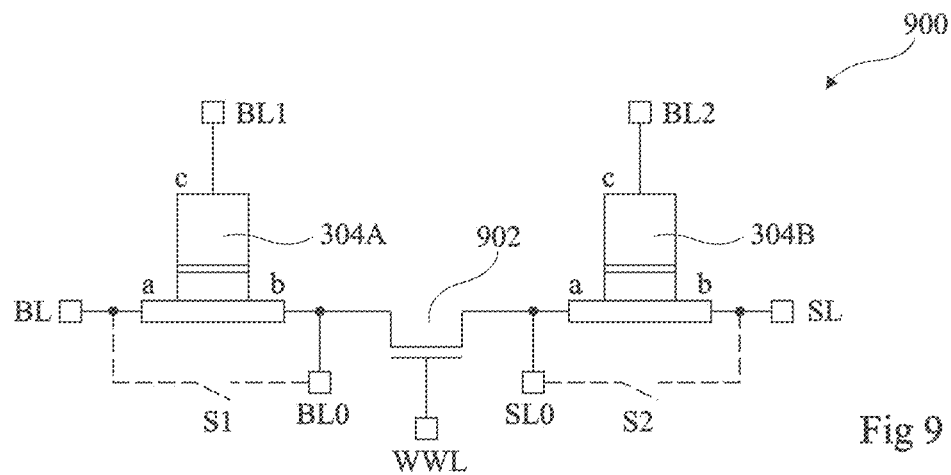
FIG. 9 schematically illustrates a non-volatile memory cell according to a further example embodiment of the present disclosure.

FIG. 9 schematically illustrates a memory cell 900 comprising two resistive storage elements 304A, 304B each being similar to the element 304 of FIG. 3 and having three terminals. The element 304A has its terminal a coupled or connected to the bit line BL, and its terminal b coupled to the terminal a of the element 304B via a transistor 902. The terminal b of the element 304A is also coupled or connected to a bit line BL0, and the terminal a of the element 304B is also coupled or connected to a source line SL0. The transistor 902 is for example an n-channel MOS transistor, and is controlled at its gate by the word line WWL. The element 304B has its terminal b coupled or connected to the source line SL. The terminals c of the elements 304A and 304B are respectively coupled to bit lines BL1 and BL2. The bit lines BL and BL0 are coupled together by the switch S1, and the source lines SL0 and SL are coupled together by the switch S2.

In operation, the elements 304A and 304B are programmed by activating the transistor 902 and the switch S1 or S2 to bypass one of the elements, and programming the other element by applying a current in one direction or the other between the bit line BL and source line SL. The elements 304A and 304B are for example read without activating the transistor 902 by applying high voltages to the bit lines BL1 and BL2 and low voltages to the bit line BL and source line SL. The elements 304A and 304B can for example be read at the same time as each other.

The memory cell 900 can for example be used in a memory array similar to the one of FIG. 8. In such a case, the word line RWL could be omitted, and additional bit lines BL1j and BL2j could for example be added to each column j.

Figure 10:
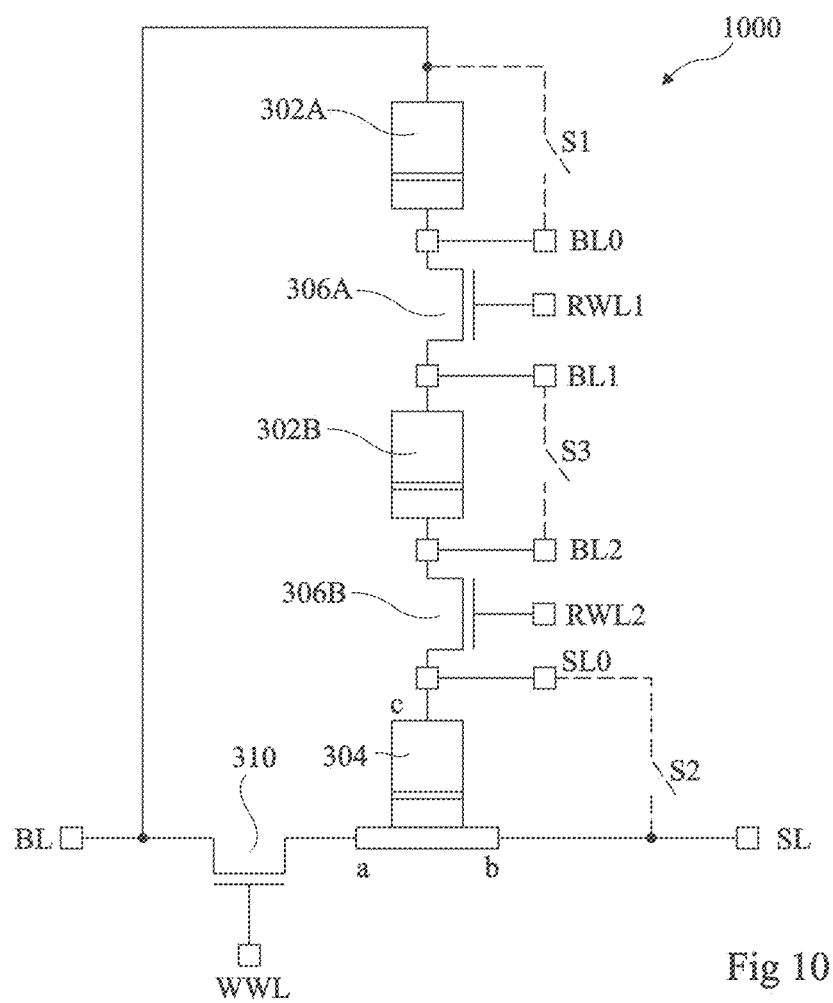
FIG. 10 schematically illustrates a non-volatile memory cell according to a further example embodiment of the present disclosure.

FIG. 10 schematically illustrates a memory cell 1000, which is similar to the memory cell 300 of FIG. 3, except that it comprises an additional resistive storage element and transistor. In particular, with respect to the embodiment of FIG. 3, in FIG. 10 the element 302 has been labelled 302A, and a new element 302B similar to the element 302 has been added. The element 302B has one terminal coupled or connected to a bit line BL1 and coupled to the bit line BL0 via a transistor 306A, and its other terminal coupled or connected to a bit line BL2 and coupled to the source line SL0 via a transistor 306B. The transistors 306A and 306B are for example n-channel MOS transistors, and they are respectively controlled by word lines RWL1 and RWL2. In addition to the switches S1 and S2 respectively coupling the bit lines BL, BL0 and source lines SL, SL0, a switch S3 for example couples the bit lines BL1 and BL2. Like the switches S1 and S2, the switch S3 can be common for more than one memory cell, for example for a column of memory cells or for all of the memory cells of the array.

In operation, one of the elements 302A, 302B and 304 can be selected to be programmed or read in a similar manner as described above, while bypassing the other two elements using two of the three switches S1, S2 and S3.

The memory cell 1000 can for example be used in a memory array similar to the one of FIG. 8. In such a case, the additional bit lines BL1j and BL2j are for example added to each column j.

Figure 11:
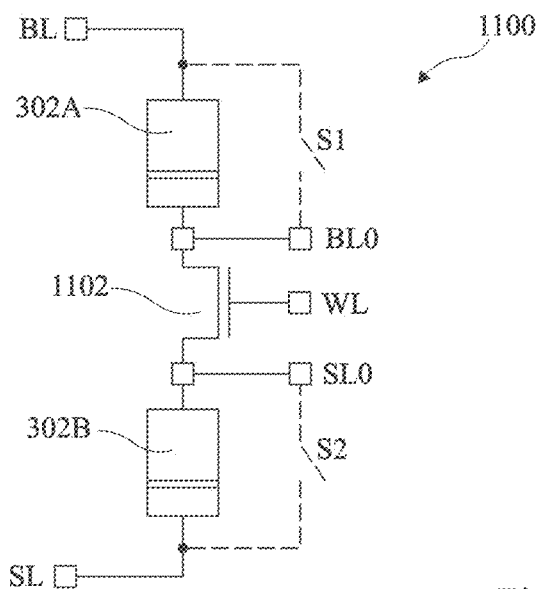
FIG. 11 schematically illustrates a non-volatile memory cell according to yet a further example embodiment of the present disclosure.

FIG. 11 schematically illustrates a memory cell 1100 comprising two resistive storage elements 302A, 302B each being similar to the element 302 of FIG. 3 and having two terminals. The memory cell 1100 comprises the series connection of the element 302A, a transistor 1102 and the element 302B between the bit line BL and the source line SL. The transistor 1102 is for example an n-channel MOS transistor and is for example controlled by a word line WL. Like in the embodiment of FIG. 3, a switch S1 couples the bit line BL to the bit line BL0 to bypass the element 302A. Similarly, a switch S2 couples the source line SL and the source line SL0 to bypass the element 302B.

In operation, a high signal is for example applied to the word line WL to activate the transistor 1102 when a read or write operation is to take place, and one or the other of the elements 302A, 302B is bypassed by the switch S1 or S2, depending on which of the elements is to be read or written.

The memory cell 1100 can for example be used in a memory array similar to the one of FIG. 8. In such a case, the word line RWL could be omitted.

Figure 12:
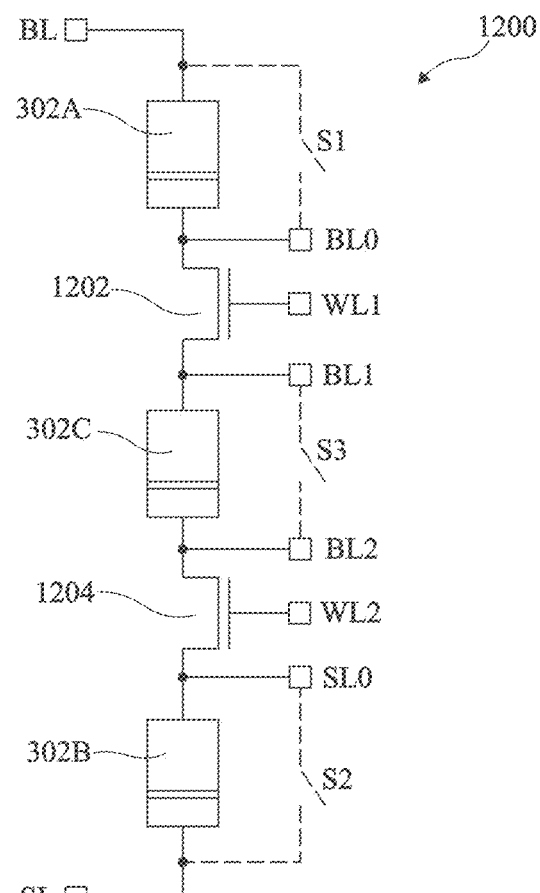
FIG. 12 schematically illustrates a non-volatile memory cell according to yet a further example embodiment of the present disclosure.

FIG. 12 illustrates yet a further example of a memory cell 1200 similar to that of FIG. 11, but further comprising an additional element 302C similar to the elements 302A and 302B, and coupled in series therewith. Furthermore, the transistor 1102 is replaced in FIG. 12 by a transistor 1202 coupling the element 302A to the element 302C, and a transistor 1204 coupling the element 302C to the element 302B. The transistors 1202 and 1204 are for example n-channel MOS transistors, and are for example respectively controlled via word lines WL1 and WL2. Additional bit lines BL1, BL2 and a third switch S3 permit the element 302C to be bypassed, such that each element 302A, 302B and 302C can be programmed in a similar manner to the elements 302A and 302B as described above.

The memory cell 1200 can for example be used in a memory array similar to the one of FIG. 8. In such a case, the word lines WWL and RWL could be replaced by the word lines WL1 and WL2, and additional bit lines BL1j and BL2j could be added to each column j.

An advantage of the embodiments described herein is that the memory cells have an increased density in terms of the number of bits that can be stored per transistor.

For example, the layout of the 1-bit SOT memory cell 200 according to the architecture of FIG. 2, based on a storage element having a diameter of 40 nm, was found to result in cell dimensions of 0.378 µm by 0.192 µm, and thus an area of 0.072 µm². When two such cells were placed alongside to provide a 2-bit storage cell, the combined size substantially doubled to 0.728 µm by 0.192 µm, and thus an area of 0.140 µm². By comparison, the layout of the 2-bit memory cell 300 according to the architecture of FIG. 3, again based on storage elements having a diameter of 40 nm, was found to have cell dimensions of 0.482 µm by 0.1.92 µm, and thus an area of 0.0927 µm². This represents an increase in the surface area of only around 20% with respect to the 1-bit cell 200. Therefore, for a 2-bit memory cell, the gain in surface area of the memory cell 300 of FIG. 3 can be around 34% with respect to the area of two of the 1-bit cells 200. The above comparison is based on the most realistic dimensions and parameters used in the art: see for example the publication "High-density SOT-MRAM based on shared bitline structure", Seo, Y. and Roy, K., IEEE Transactions on Very Large Scale Integration (VLSI) Systems, 26(8), 1600-1603 (2018).

This area gain results from the fact that the architecture of the 2-bit cell 300 has the same number of transistors as the 1-bit cell 200, but with a storage capacity that is doubled. Indeed, by mutualizing the control of the two storage elements of the cell, the area increase when passing from 1-bit storage to 2-bit storage can be relatively low. On the contrary, architectures of 2-bit cells in the prior art, including hybrid cells, generally result in a doubling of the cell area with respect to a 1-bit cell.

Furthermore, memory cells having resistive storage elements with three terminals provide the additional advantage of robust read operations that have a relatively low risk of overwriting the stored data.

Various embodiments and variants have been described. Other variants will readily occur to those skilled in the art. For example, it will be apparent to those skilled in that art that while the use of n-channel MOS transistors has been described in the various embodiments, one or more of these transistors could be replaced by p-channel MOS transistors, or by transistors using other transistor technologies. It will be apparent to those skilled in the art how any of the circuits could be implemented using only PMOS transistors, for example by inverting the transistor control signals.

Furthermore, it will be apparent to those skilled in the art that while examples of word lines (i.e. row lines) and column lines (i.e. bit and source lines) have been described, in alternative embodiments any of these lines could be implemented by either a row or column line.

Furthermore, it will be apparent to those skilled in the art that the various features described in relation to the various embodiments could be combined, in alternative embodiments, in any combination. For example, it would be apparent to those skilled in the art that a memory array could comprise a mixture of two or more of the types of memory cells described in relation with FIGS. 3 and 9 to 12.

The invention claimed is:

1. A memory comprising an array of memory cells, each memory cell comprising:
    first and second resistive storage elements each having at least first and second terminals; and
    a first transistor having:
        a first main conducting node connected to the first terminal of the first resistive element and to a first column/row line of the array; and a second main conducting node connected to the first terminal of the second resistive element and to a second column/row line of the array; and a switch circuit comprising:
a first switch configured to be capable of coupling together the first and second terminals of the first resistive storage element of each memory cell of a first row or column of the array; and
a second switch configured to be capable of coupling together the first and second terminals of the second resistive storage element of each memory cell of the first row or column of the array.

2. The memory of claim 1, wherein the first transistor further comprises a gate node connected to a third column/row line of the array.

3. The memory of claim 1, wherein:
the second terminal of the first resistive element is connected to a fourth column/row line of the array; and
the second terminal of the second resistive element is connected to a fifth column/row line of the array.

4. The memory of claim 3, wherein the first resistive storage element is configured to be programmable to have a high or low resistive state as a function of the direction of a write current driven through its first and second terminals.

5. The memory of claim 3, wherein the second resistive storage element further comprises a third terminal and is configured to be programmable to have a high or low resistive state as a function of the direction of a write current driven through its second and third terminals.

6. The memory of claim 5, wherein each memory cell further comprises a second transistor coupling the third terminal of the second resistive storage element to the fourth column/row line.

7. The memory of claim 3, wherein the second resistive element is configured to be programmable to have a high or low resistive state as a function of the direction of a write current driven through its first and second terminals.

8. The memory of claim 3, wherein the first and second resistive elements each comprise a third terminal and are configured to be programmable to have a high or low resistive state as a function of the direction of a write current driven through its second and third terminals.

9. The memory of claim 1, wherein each memory cell further comprises:
a third resistive storage element having first and second terminals; and
a third transistor having:

a first main conducting node connected to the second terminal of the first resistive storage element; and
a second main conducting node connected to the first terminal of the third resistive storage element and to a sixth column/row line of the array.

10. The memory of claim 1, wherein at least one of the first and second resistive storage elements is a magnetic storage element.

11. The memory of claim 1, wherein at least one of the first and second resistive storage elements is one of:
a spin transfer torque (STT) element with in-plane anisotropy;
a spin transfer torque element with perpendicular-to-plane anisotropy;
a spin orbit torque magnetic tunnel junction (SOT-MTJ);
a metal oxide RAM (OxRAM) element;
a phase change RAM (PCRAM) element;
a phase change RAM (PCRAM) element;
a ferroelectric RAM (FeRAM) element; and
a conductive bridging RAM (CBRAM) element.

12. A method of accessing a memory cell of an array, each memory cell having first and second resistive storage elements each having first and second terminals, and a first transistor coupling together first terminals of the first and second resistive storage elements, the method comprising:
bypassing, using a switch circuit, one of the first and second resistive storage elements via column/row lines of the memory array in order to access the other of the first and second resistive storage elements, the switch circuit comprising:
a first switch configured to be capable of coupling together the first and second terminals of the first resistive storage element of each memory cell of a first row or column of the array; and
a second switch configured to be capable of coupling together the first and second terminals of the second resistive storage element of each memory cell of the first row or column of the array.

13. The method of claim 12, further comprising:
applying a first voltage to a fourth column/row line of the array connected to the second terminal of the first resistive element; and
applying a second voltage to a fifth column/row line of the array connected to the second terminal of the second resistive element.

* * * * *